(12) United States Patent
Rini et al.

(10) Patent No.: US 6,571,569 B1
(45) Date of Patent: Jun. 3, 2003

(54) METHOD AND APPARATUS FOR HIGH HEAT FLUX HEAT TRANSFER

(75) Inventors: Daniel P. Rini, Oviedo, FL (US); H. Randolph Anderson, Clermont, FL (US); Jayanta Sankar Kapat, Oviedo, FL (US); Louis Chow, Winter Park, FL (US)

(73) Assignee: Rini Technologies, Inc., Orlando, FL (US)

(*) Notice: Subject to any disclaimer, the term of this patent is extended or adjusted under 35 U.S.C. 154(b) by 0 days.

(21) Appl. No.: 10/115,510

(22) Filed: Apr. 2, 2002

Related U.S. Application Data

(60) Provisional application No. 60/350,857, filed on Jan. 22, 2002, provisional application No. 60/350,871, filed on Jan. 22, 2002, provisional application No. 60/350,687, filed on Jan. 22, 2002, provisional application No. 60/290,368, filed on May 12, 2001, provisional application No. 60/286,288, filed on Apr. 26, 2001, provisional application No. 60/286,771, filed on Apr. 26, 2001, and provisional application No. 60/286,289, filed on Apr. 26, 2001.

(51) Int. Cl.⁷ .............................................. F25D 23/12
(52) U.S. Cl. ................ 62/259.2; 62/259.4; 62/304; 257/715; 361/700
(58) Field of Search ........................ 62/259.2, 259.4, 62/121, 373, 375, 506, 304, DIG. 10; 165/80.4; 174/15.1; 257/714, 715; 361/689, 699, 700, 704

(56) References Cited

U.S. PATENT DOCUMENTS

| 4,068,495 A | 1/1978 | Alger et al. |
| 4,141,224 A | 2/1979 | Alger et al. |
| 4,306,278 A | 12/1981 | Fulton et al. |
| 4,413,345 A | 11/1983 | Altmann |
| 4,444,495 A | 4/1984 | Bramwell et al. |
| 4,776,181 A | 10/1988 | Maule |
| 4,791,634 A | 12/1988 | Miyake |
| 5,105,430 A | 4/1992 | Mundinger et al. |
| 5,220,804 A | 6/1993 | Tilton et al. |
| 5,263,536 A | 11/1993 | Hulburd et al. |
| 5,406,807 A | 4/1995 | Ashiwake et al. |

(List continued on next page.)

Primary Examiner—Denise L. Esquivel
Assistant Examiner—Marc Norman
(74) Attorney, Agent, or Firm—Saliwanchik, Lloyd & Saliwanchik

(57) ABSTRACT

The subject invention pertains to a method and apparatus for high heat flux heat transfer. The subject invention can be utilized to transfer heat from a heat source to a coolant such that the transferred heat can be effectively transported to another location. Examples of heat sources from which heat can be transferred from include, for example, fluids and surfaces. The coolant to which the heat is transferred can be sprayed onto a surface which is in thermal contact with the heat source, such that the coolant sprayed onto the surface in thermal contact with the heat absorbs heat from the surface and carries the absorbed heat away as the coolant leaves the surface. The surface can be, for example, the surface of an interface plate in thermal contact with the heat source or a surface integral with the heat source. The coolant sprayed onto the surface can initially be a liquid and remain a liquid after absorbing the heat, or can in part or in whole be converted to a gas or vapor after absorbing the heat. The coolant can be sprayed onto the surface, for example, as a stream of liquid after being atomized, or in other ways which allow the coolant to contact the surface and absorb heat. Once the heat is absorbed by the coolant, the coolant can be transported to another location so as to transport the absorbed heat as well.

64 Claims, 11 Drawing Sheets

U.S. PATENT DOCUMENTS

| | | |
|---|---|---|
| 5,453,641 A | 9/1995 | Mundinger et al. |
| 5,471,491 A | 11/1995 | Phillips et al. |
| 5,526,372 A | 6/1996 | Albrecht et al. |
| 5,687,577 A | 11/1997 | Ballard et al. |
| 5,718,117 A | 2/1998 | McDunn et al. |
| 5,768,103 A | 6/1998 | Kobrinetz et al. |
| 5,818,692 A | 10/1998 | Denney, Jr. et al. |
| 5,854,092 A | 12/1998 | Root et al. |
| 5,880,931 A | 3/1999 | Tilton et al. |
| 5,907,473 A | 5/1999 | Przilas et al. |
| 5,943,211 A | 8/1999 | Havey et al. |
| 5,992,159 A | 11/1999 | Edwards et al. |
| 5,999,404 A | 12/1999 | Hileman |
| 6,064,572 A | 5/2000 | Remsburg |
| 6,085,833 A * | 7/2000 | Kimura et al. ............... 165/185 |
| 6,108,201 A | 8/2000 | Tilton et al. |
| 6,498,725 B2 * | 12/2002 | Cole et al. ................... 361/700 |
| 2001/0002541 A1 * | 6/2001 | Patel et al. ................. 62/259.2 |

* cited by examiner

US 6,571,569 B1

METHOD AND APPARATUS FOR HIGH HEAT FLUX HEAT TRANSFER

CROSS-REFERENCE TO RELATED APPLICATION(S)

This application claims priority from U.S. provisional patent application U.S. Ser. No. 60/350,857, filed Jan. 22, 2002; U.S. provisional patent application U.S. Ser. No. 60/350,871, filed Jan. 22, 2002; U.S. provisional patent application U.S. Ser. No. 60/350,687, filed Jan. 22, 2002; U.S. provisional patent application U.S. Ser. No. 60/290,368, filed May 12, 2001; U.S. provisional patent application U.S. Ser. No. 60/286,288, filed Apr. 26, 2001; U.S. provisional patent application U.S. Ser. No. 60/286,771, filed Apr. 26, 2001; and U.S. provisional patent application U.S. Ser. No. 60/286,289, filed Apr. 26, 2001.

BACKGROUND OF THE INVENTION

In recent years, attention has been focused on methods of high heat flux removal at low surface temperatures. This is due in large part to the advancing requirements of the electronics industry that prevent high temperature heat transfer due to the operating conditions of electronics. Though the heat transfer process is very complex and still not completely understood, many evaporative spray cooling experiments have been performed which indicated the high heat removal capability of this cooling technique. The spray technique generally works in the following way; a spray nozzle is used to atomize a pressurized liquid, and the resulting droplets are impinged onto a heated surface. A thin film of liquid is formed on the heat transfer surface in which nucleate boiling takes place. The droplet impingement simultaneously causes intense convection and free surface evaporation. When a liquid with a high latent heat of vaporization (such as water) is used, over 1 $kW/cm^2$ of heat removal capability has been demonstrated.

The temperature of the cooled surface is determined by the boiling point of the liquid. Since the resulting heat transfer coefficient is very large (50,000 to 500,000 $W/m^2C$) the surface temperature will be only a few degrees centigrade above the boiling point of liquid.

This type of cooling technique is most appropriately implemented when used to cool high heat flux devices such as power electronics, microwave and radio frequency generators, and diode laser arrays.

Prior art describes processes and devices related to cooling of small, individual electronic chips. This can be seen in, for example, U.S. Pat. Nos. 5,854,092; 5,718,117; and 5,220,804. This prior art uses a liquid spray to cool individual electronic components, or an array of these individual components located at discrete distances from each other. Since the electronic components (the heat sources) are individual devices with spaces between, the liquid spray cones do not overlap or interact with each other. The typical size of an electronic chip is 2 $cm^2$ in area and is spaced at a distance of 0.5 to 1 cm. This allows the prior art to cool these chips with an impinging spray without interfering with the spray process of the surrounding chips.

As stated above, diode laser arrays and microwave generators are devices that can be cooled with this type of impinging spray technology. Current market forces are driving these devices to increased power and size requirements. As a result, high heat flux devices are now being designed with surface areas much larger than 2 $cm^2$. New high heat flux devices will be 100 $cm^2$ to 1000 $cm^2$. The entire large surface area will need to be cooled at the same high heat flux rate as the small devices were in the prior art. However, the prior art does not detail a method to cool such a large device. Prior art only details a method to cool several small individual devices.

It may be thought that a large surface could be cooled with an array of nozzles spraying down on the large surface in the same way a single nozzle sprays down on a small surface, as shown in the prior art. However, it has been shown in a study with air jet impingement that scaling in this way is not possible. Simply put, the effectiveness of the jets or sprays in the center of the array interact with each other in a way that considerably reduces the ability to transfer heat. This is a result of the fluid flow accumulating as the fluid moves outward from the stagnation point. A good portion of the impinging droplets are vaporized with this system, however, this is not so for all the liquid. The remaining liquid will flow off the heated surface and be returned to the pump. When the surface is large, the fluid from the nozzles at the center of the surface will need to travel across the entire surface before exiting at the edges. This can be called the "spray liquid run-off problem."

BRIEF SUMMARY OF THE INVENTION

The subject invention pertains to a method and apparatus for high heat flux heat transfer. The subject invention can be utilized to transfer heat from a heat source to a coolant such that the transferred heat can be effectively transported to another location. Examples of heat sources from which heat can be transferred from include, for example, fluids and surfaces. The coolant to which the heat is transferred can be sprayed onto a surface which is in thermal contact with the heat source, such that the coolant sprayed onto the surface in thermal contact with the heat absorbs heat from the surface and carries the absorbed heat away as the coolant leaves the surface. The surface can be, for example, the surface of an interface plate in thermal contact with the heat source or a surface integral with the heat source. The coolant sprayed onto the surface can initially be a liquid and remain a liquid after absorbing the heat, or can in part or in whole be converted to a gas or vapor after absorbing the heat. The coolant can be sprayed onto the surface, for example, as a stream of liquid after being atomized, or in other ways which allow the coolant to contact the surface and absorb heat. Once the heat is absorbed by the coolant, the coolant can be transported to another location so as to transport the absorbed heat as well.

The subject invention pertains to a method and apparatus for cooling surfaces and/or devices. In a specific embodiment, the subject invention can incorporate a spray nozzle and a cooling/electronic interface surface. The spray nozzle may use pressurized liquid (commonly known as pressure atomizer nozzles), pressurized liquid and pressurized vapor (commonly known as vapor assist nozzles), and/or pressurized vapor nozzle (commonly known as vapor blast or vapor atomizer nozzles) to develop the atomized liquid spray used in the cooling process.

In a specific embodiment, the cooling/electronic interface surface can be compartmentalized such that spray entering one compartment is impeded from crossing over to adjacent compartments. In a further specific embodiment, a plurality of nozzles can each spray into one of a plurality of compartments such that spray from each individual nozzle is applied to a specific target area. For example, each nozzle may spray one compartment. The excess liquid which enters each compartment can then be forced out of the compartment in a counter-parallel flow from the spray direction rather than a perpendicular flow as in prior art, so as to correct the liquid run-off problem. The shape and depths of the compartments can vary according to the type of nozzle used to atomize the liquid coolant. Preferably, the subject compartments incorporate side walls which can redirect the exiting flow in a pattern that is not perpendicular to the incoming flow.

The atomized spray can be directed onto the rear surface of the compartmentalized interface plate. The spray is preferably positioned to create the most even application of atomized liquid onto the entire rear surface. The liquid can be sprayed at a temperature near its boiling point. Thus, when the liquid hits the heated surface in the rear of the compartment, the liquid can begin to boil. The heat from the electronics, or other heat source, is transferred through the interface into the boiling liquid spray at a very high rate. The created coolant vapor and excess liquid exit the compartment in a direction that is not perpendicular to the incoming flow. Under the operating conditions of an open loop system, the boiling point of the liquid coolant must be at ambient pressure since the evaporating environment is exposed to the ambient. Under these conditions, the heat removed by the developed vapor is released to the atmosphere. However, not all vaporized coolants can be responsibly released to the atmosphere, due, for example, to environmental concerns. In addition, coolants with boiling points other than ambient may be preferred. Accordingly, specific embodiments of the subject invention can be operated in a closed loop.

In a closed loop system, the interface plate can be located within a sealed housing so that the spray and the resultant vapor is trapped within the sealed housing. Under this condition, the pressure within the housing can influence the boiling point of the coolant and the operating temperature. As the coolant vaporizes, it carries the heat from, for example, electronics, away from the interface plate. Since the system is now closed, the vapor can be condensed and the heat released out of the housing through a condenser. The condenser can incorporate, for example, a standard heat exchanger or can operate via a sub-cooled mist of the coolant sprayed within the housing. The mist can be sub-cooled below the saturation temperature of the coolant within the housing via an external heat exchanger. As the sub-cooled liquid spray contacts the saturated vapor, heat is transferred to the spray and the vapor condenses on the liquid droplets and flows to a liquid reservoir.

The coolant can be drawn from the liquid reservoir, for example, by a liquid pump or via venturi action of a vapor atomizer nozzle. The liquid then flows through the nozzle and is once again sprayed onto the interface plate. The circulation of the coolant within the closed process depends on the type of atomizer nozzles used. If pressure atomizer nozzles are used, then a liquid pump can suffice. If vapor assist nozzles or vapor atomizer nozzles are used, then both a vapor compressor and a liquid pump can be used in the circulation of the coolant.

Typically, the heat gained by the liquid in the closed system is transferred to a refrigerant of a vapor compression cycle via a heat exchanger. The vapor compression cycle increases the temperature of the now warmer refrigerant and allows it to release the heat to the environment. This is commonly known as the chiller loop.

An additional feature can be added to the closed system that combines it with a vapor compression cycle without the heat exchanger interface between the two loops. This combination involves using a refrigerant as the coolant in both loops. Under this scenario, liquid refrigerant can be atomized onto the interface plate. Vapor and excess liquid refrigerant can be expelled from the compartment and flow into the housing. The saturated vapor can be removed from the housing with a vapor compressor and can be compressed to a temperature above ambient temperature of the final heat sink, for example atmospheric air. The now superheated vapor can flow through a heat exchanger releasing the heat to the final heat sink. As the heat is released, the superheated vapor condenses to liquid refrigerant. As is common to vapor compression cycles, the higher pressure saturated liquid can flow through an expansion valve. The liquid is allowed to expand to the pressure of the housing, cools to its saturation temperature within the housing, and flows to the liquid reservoir ready to begin the process once again.

DETAILED DESCRIPTION OF THE INVENTION

The subject invention pertains to a method and apparatus for high heat flux heat transfer. The subject invention can be utilized to transfer heat from a heat source to a coolant such that the transferred heat can be effectively transported to another location. Examples of heat sources from which heat can be transferred from include, for example, fluids and surfaces. The coolant to which the heat is transferred can be sprayed onto a surface which is in thermal contact with the heat source, such that the coolant sprayed onto the surface in thermal contact with the heat absorbs heat from the surface and carries the absorbed heat away as the coolant leaves the surface. The surface can be, for example, the surface of an interface plate in thermal contact with the heat source or a surface integral with the heat source. The coolant sprayed onto the surface can initially be a liquid and remain a liquid after absorbing the heat, or can in part or in whole be converted to a gas or vapor after absorbing the heat. The coolant can be sprayed onto the surface, for example, as a stream of liquid after being atomized, or in other ways which allow the coolant to contact the surface and absorb heat. Once the heat is absorbed by the coolant, the coolant can be transported to another location so as to transport the absorbed heat as well.

Figure 1:
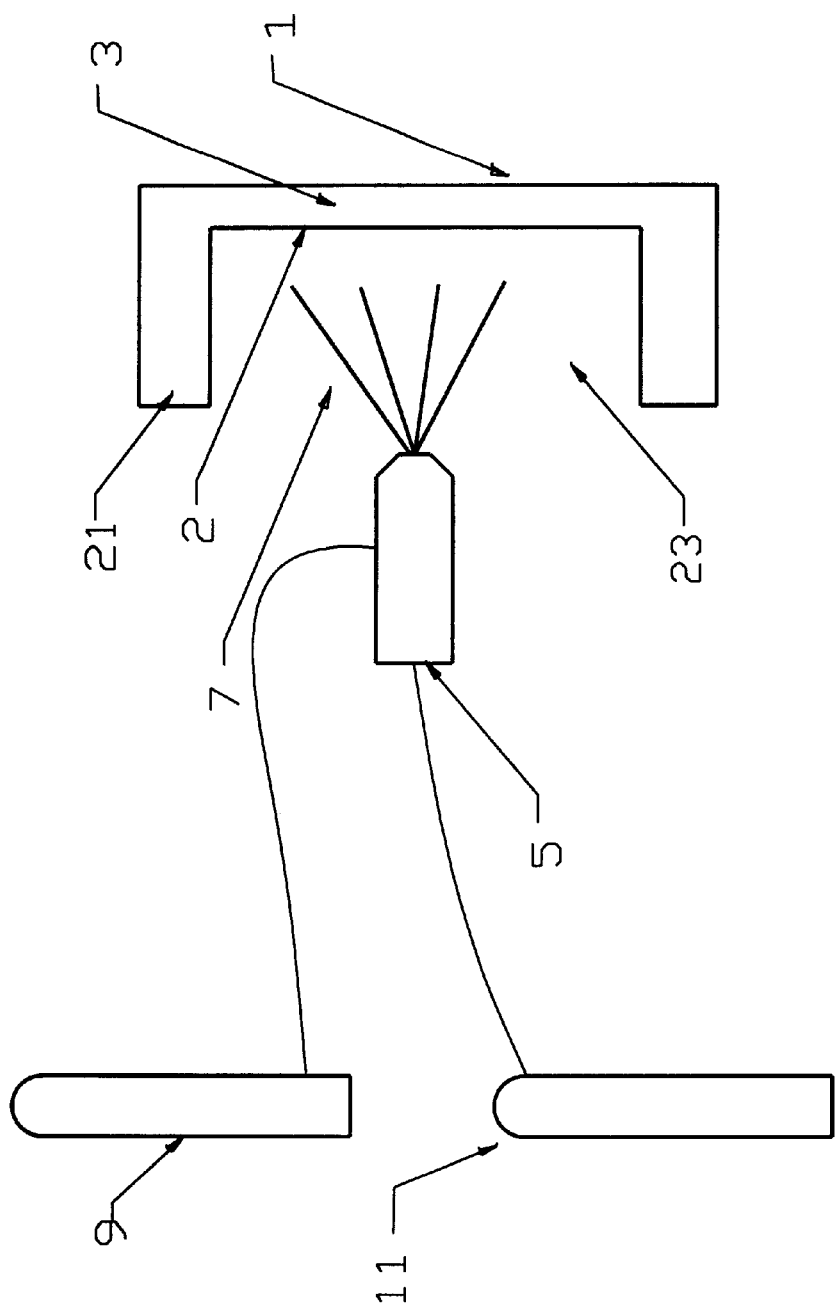
FIG. 1 shows a schematic illustration of a spray-nozzle spraying the atomized liquid coolant into a cell of a cooling plate in accordance with a specific embodiment of the subject invention.

In a specific embodiment, the subject invention relates to a cooling process which begins, as shown in FIG. 1, by attaching a heat source such as a high power electrical device to surface 1 of interface plate 3. Interface plate 3, as in the other embodiments of the subject invention, can be a separate plate in thermal contact with a heat source, or can be integral with a heat source, for example, a wall of a device producing heat which needs to be removed. Referring to the specific embodiment shown in FIG. 1, spray nozzle 5 atomizes liquid coolant into a spray compartment in a uniform spray pattern 7. If spray nozzle 5 is a pressure atomizer nozzle, then pressured liquid coolant can be supplied by a pressurized liquid source 9. This source can be, for example, a compressed storage tank or a supply pump drawing liquid coolant from a reservoir. If spray nozzle 5 is a vapor atomizing nozzle, then pressurized vapor can be supplied to spray nozzle 5 via compressed vapor source 11. The compressed vapor source 11 can be, for example, a compressed vapor storage tank or a vapor compressor. The flow of vapor through the vapor atomizing nozzle 5 can create a venturi draft on the liquid port such that the pressurized liquid source 9 need not be pressurized but, rather, can be, for example, a reservoir of liquid coolant. If spray nozzle 5 is a vapor assist nozzle then both the pressurized liquid source 9 and the pressurized vapor source 11 can be supplied to nozzle 5. The pressurized sources 9 and 11 can be supplied, for example, via pressurized storage tanks and/or a liquid pump and/or a vapor compressor.

Figure 2A:
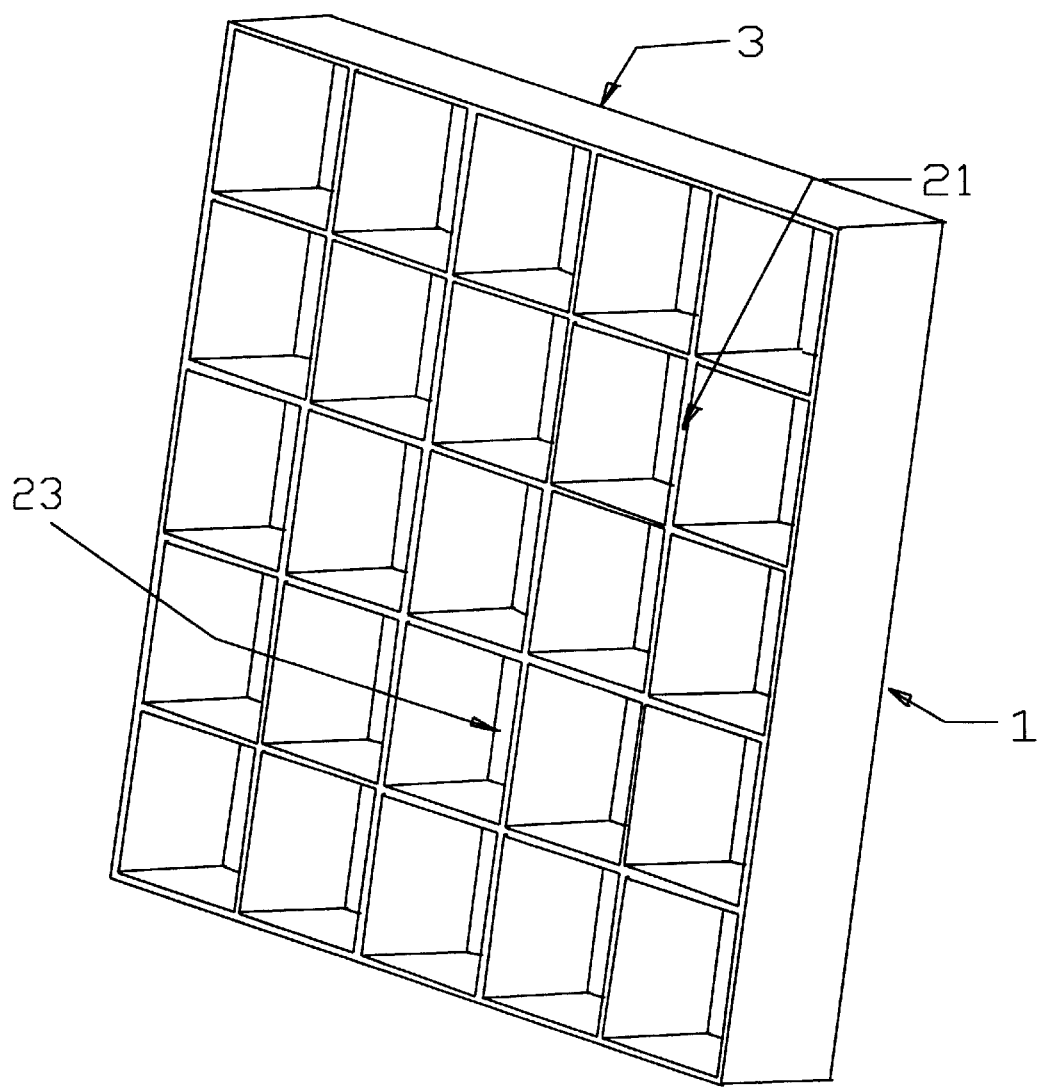
FIGS. 2A–2C show specific embodiments of a cooling plate having a plurality of cells, or compartments, in accordance with a specific embodiment of the subject invention.

A specific embodiment of an interface plate 3 in accordance with the subject invention is shown in FIG. 2A. The cooling plate 3 shown in FIG. 2A incorporates a set of partition walls 21 that protrude from the heated surface 2 of interface plate 3 and form subsections, or cells 23. In a preferred embodiment, each cell 23 has a surface area on surface 2 of about 0.5 to 2 cm². The walls can give the interface plate 3 an "ice cube tray" look, and protrude, for example, about 0.2 cm to 2 cm from surface 2. The shape of the subsections, or cells, can be, for example, circular, square, or other polygonal shapes. In a specific embodiment, the subsections can be honeycomb shaped. The surface area of the cells and the height to which the cell walls 21 protrude from surface 2 are preferably selected such that the coolant which is sprayed into the cell, after removing heat from surface 2, can escape from the cell without interfering with the heat transfer occurring in adjacent cells. Partition walls 21 shown in FIGS. 1 and 2A–2C can be used to reduce, or substantially eliminate, the flow of coolant incident on surface 2 out of cell 23 and into adjacent cells and reduce, or substantially eliminate, the flow of coolant incident on surface 2 of adjacent cells into cell 23. The coolant departing the subsection, or cell, in gas or vapor form can escape to the environment or, in the case of a closed system can be captured, converted back to liquid form, and resprayed onto surface 2. The coolant departing the subsection in liquid form can flow past the end of partition walls 21, be captured, optionally cooled, and resprayed onto surface 2. Other flow patterns, such as along the end of partition wall 21, can occur depending on the various parameters of the system.

Figure 2B:
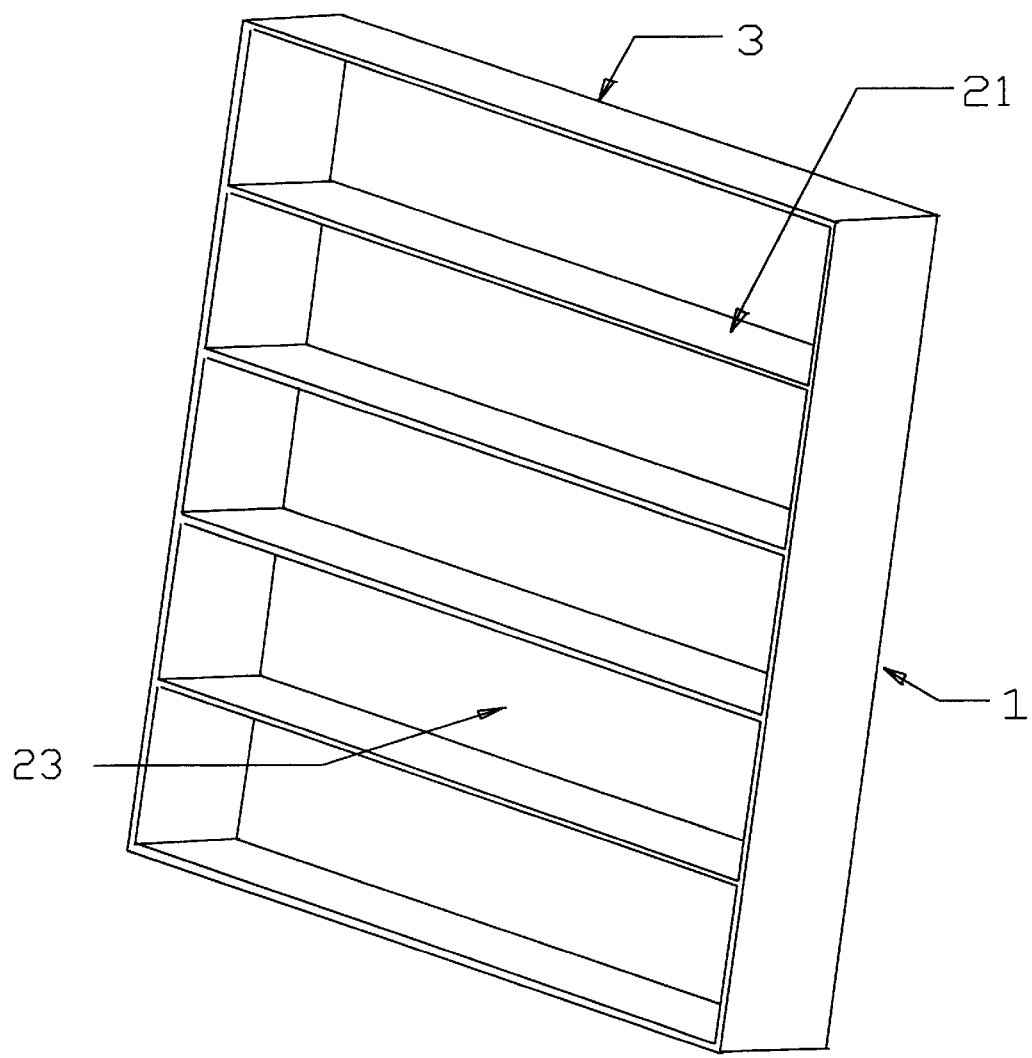

The number of compartments can be determined by the area of each compartment, the widths of the compartment walls 21, and the total area of desired cooling. Each compartment can have one or more nozzles which spray into the compartment. In a specific embodiment, the one or more nozzles spray onto the heated surface 2 at the bottom of the compartment. FIG. 2B shows a partition wall pattern which can accommodate more than one spray nozzle spraying into each cell 23. Each cell 23 shown in FIG. 2B can accommodate, for example, four spray nozzles. Although the partition walls 21 shown in FIGS. 2–2C form a rectangular or square patterns and are of essentially constant thickness from end to end, other patterns can be utilized and the thickness of partition walls 21 can vary, depending on the application. For example, a hexagonal or other polygonal pattern, or even circular cells 23, may be preferred. In addition, the partition walls 21 may have an increased thickness near surface 2 to enhance the redirecting of the coolant flow out of the cell. Such increased thicknesses near surface 2 can provide a curved shaped wall such that coolant flowing on surface 2 and reaching the wall experiences a curved surface to transition from surface 2 onto the side of wall 21 rather than an abrupt corner between wall 21 and surface 2.

In a specific embodiment of the subject invention, partition walls 21 can be removed and a plurality of spray nozzles can spray surface 2 such that the spray of the adjacent nozzles does not overlap and the liquid coolant sprayed onto surface 2 travels along the surface of surface liquid 2 until running into the liquid coolant sprayed onto surface 2 by an adjacent nozzle. As the flows of coolant from adjacent spray nozzles collide, the collision can change the momentum of the flows such that at least a portion, and preferably essentially all, of the combined flow flows away from surface 2. Accordingly, after the collision of adjacent flows, a substantial portion of the combined flow's momentum can then be in a direction perpendicular to surface 2. In addition, the combined flow may have a certain amount of momentum parallel to surface 2, such that the combined flow flows as a river, above surface 2, near the portion of surface 2 where the collision of the two adjacent flows occurs. The direction of these river flows depends, among other factors, on the spray patterns of the adjacent spray nozzles, the speed of the spray, and the form of the coolant being sprayed onto surface 2. When partition walls are present, how far out partition walls 21 protrude from surface 2 can impact how the coolant which impinges on surface 2 flows away from cell 23. Partition walls 21 can protrude sufficiently far such that coolant impinging on surface 2, upon reaching the end of the partition wall, continues away from interface plate 3. Alternatively, if partition walls are made to protrude less, coolant reaching the ends of the partition walls can, at least in part, flow in a river flow along the ends of the partition walls. Again, the exact nature of how the coolant flows after reaching the ends of the partition walls is dependent, among other factors, on the spray patterns of the adjacent spray nozzles, the speed of the spray, and the size and form of the coolant being spraying onto surface 2.

Figure 2C:
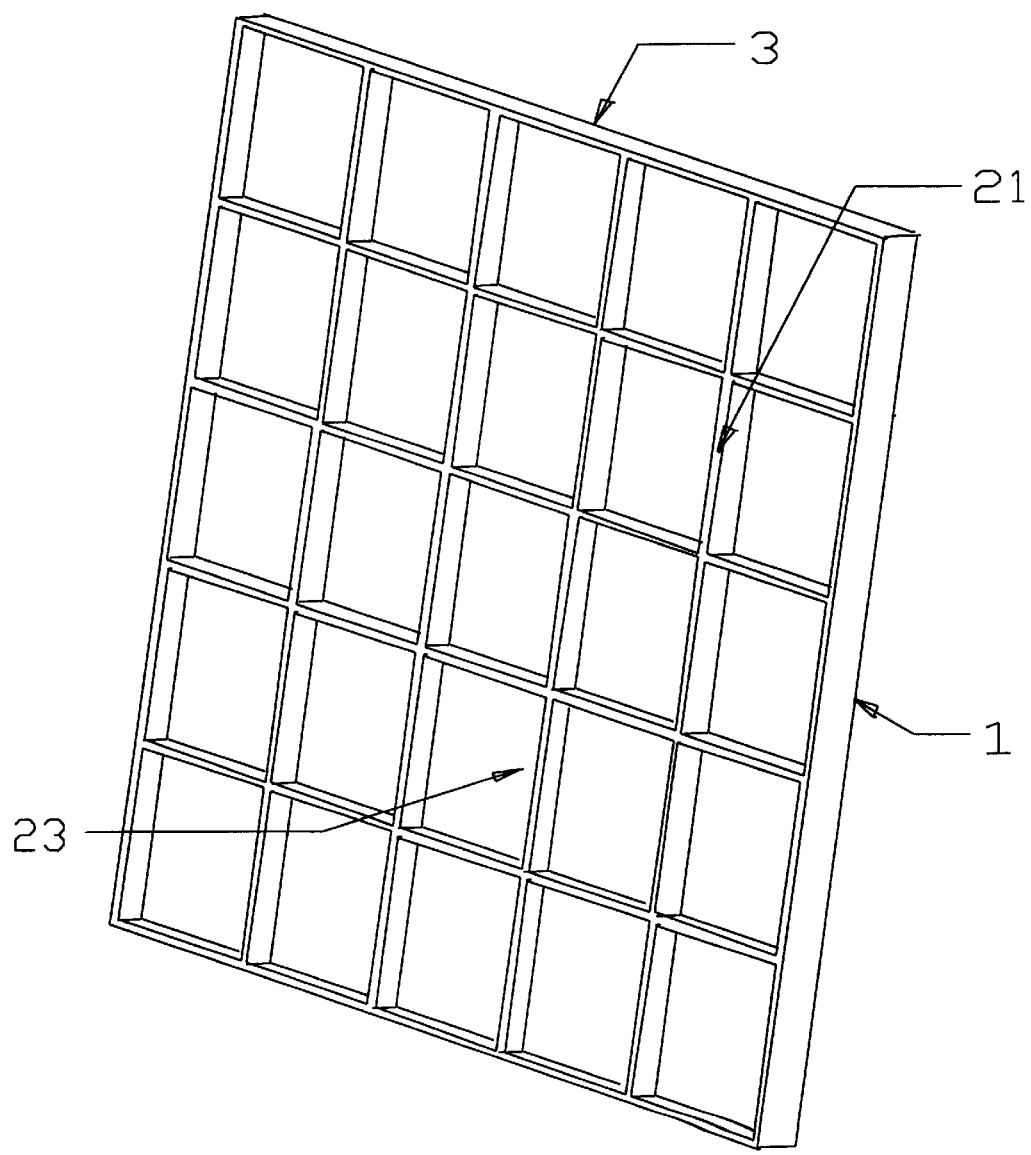
Figure 3:
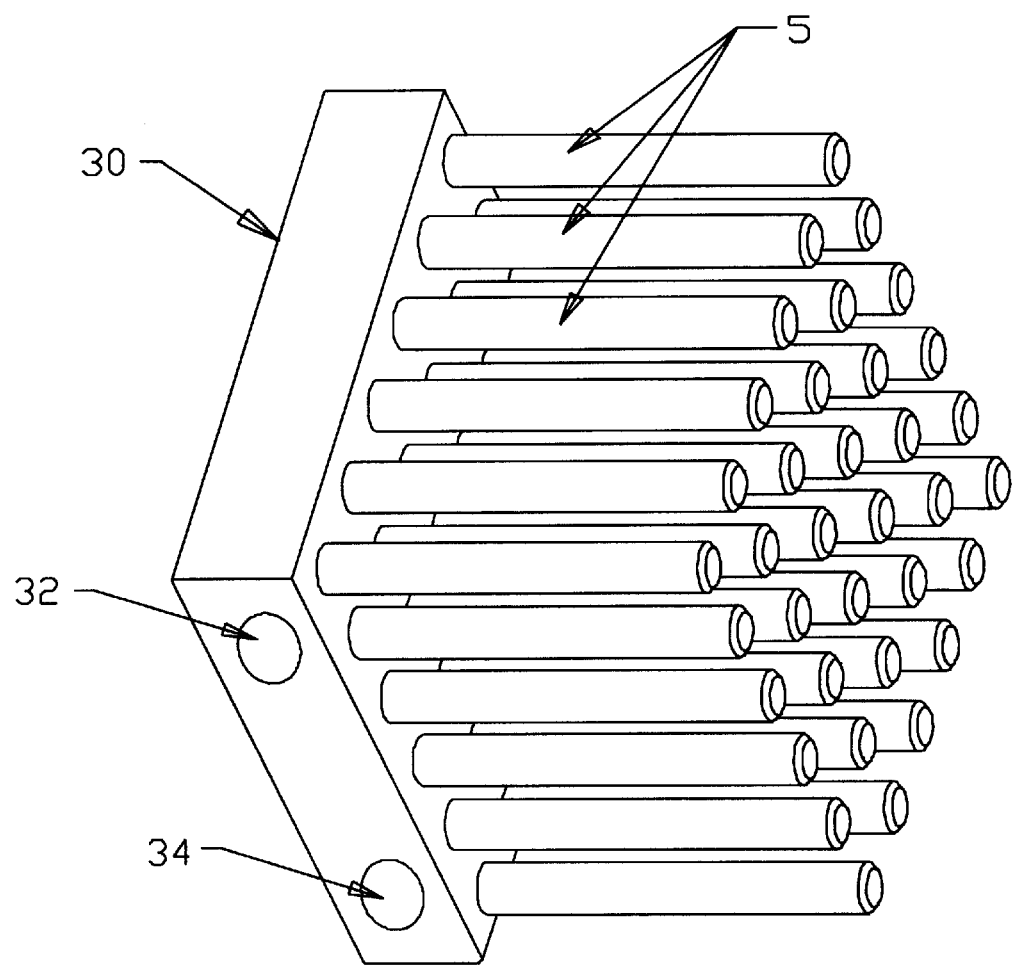
FIG. 3 shows a manifold of spray nozzles in accordance with a specific embodiment of the subject invention.
Figure 4:
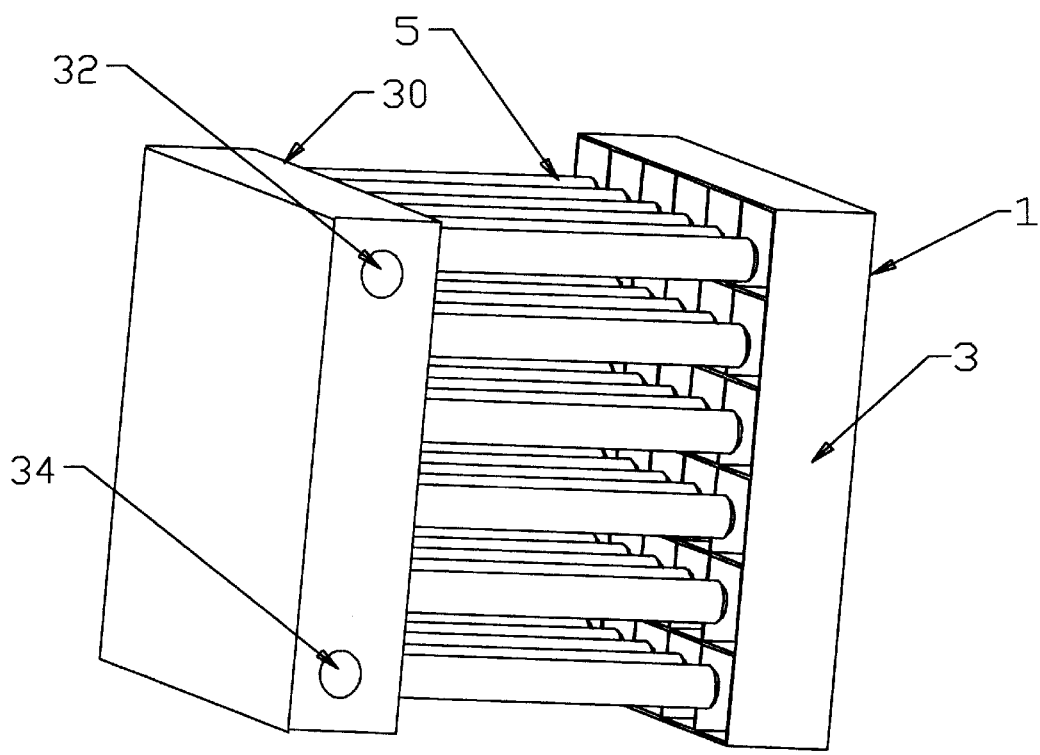
FIG. 4 shows the manifold of spray nozzles from FIG. 3 aligned with the plurality of cells from FIG. 2.

A manifold of spray nozzles in accordance with a specific embodiment of the subject invention is shown in FIG. 3. The spray nozzles 5 can be attached to manifold 30 with liquid inlet port 32 and vapor inlet port 34. A specific assembly of spray nozzle manifold 30 and compartmentalized interface plate 3 is shown in FIG. 4. In the embodiment shown in FIG. 4, each spray nozzle of the manifold of spray nozzles sprays coolant into a corresponding cell of the plurality of cells 23. In an alternative embodiment, more than one spray nozzle can spray coolant into a single cell. FIGS. 2B and 2C show embodiments of interface plates which can accommodate more than one spray nozzle per cell or compartment.

In alternative embodiments, surface 2 can be a surface of a heat source such as an electronics circuit chip, power electron device, microwave or radio frequency generator, or diode laser array. In the situation where surface 2 is a surface of a heat source, partition walls 21 can be integral with the surface 2 of the heat source, or partition walls 21 can be part of a separate interface plate 3 without a surface 1 or surface 2 such that the partition walls themselves are the interface plate 3. In the latter case, interface plate 3, comprising partition walls 21 can be pressed against surface 2 of the heat source. If desired, a means for creating a seal between the partition walls 21 and surface 2. Such a sealing means can reduce, or substantially eliminate, flow of coolant between the ends of partition walls 21 and surface 2. In a specific embodiment, such means for sealing can be attached to the ends of partition walls 21 which will contact surface 2 of the heat source, such that as the ends of partition walls 21 are pressed against surface 2 a seal between the ends of partition walls 21 and surface 2 is created so as to reduce, or substantially eliminate, flow of coolant between the ends of partition walls 21 and surface 2. In a specific embodiment, interface plate 3 can be fixedly positioned with respect to a manifold of spray nozzles such that the manifold-interface plate combination can be brought into contact with a surface 2 of a heat source and operated to remove heat from surface 2 of the heat source.

Spray nozzles in accordance with the subject invention can spray, for example, jet sprays of coolant and or atomized sprays of coolant. Jet spray nozzles can spray liquid coolant in, for example, a solid cone or sheet such that the coolant hits the surface and breaks up. The coolant can then flow across surface 2. Atomizing spray nozzles can atomize the coolant into droplets of appropriate size and can provide the droplets with an appropriate velocity. Although a variety of droplet sizes and velocities can be utilized in accordance with the subject invention, in a specific embodiment an atomizing spray nozzle can be used which produces droplets having mean diameters in a range from about 10 microns to about 200 microns and provides the droplets a velocity in a range from about 5 meters per second to about 50 meters per second. Preferably, the size and velocity of the particles are such that the effects of gravity are negligible. Utilizing small droplets at high velocity can allow the method and apparatus of the subject invention to be used with heated surfaces 2 oriented in a variety of directions (e.g. vertical or horizontal) and can make it easier to provide coverage of the surface 2 with the spray coolant.

With high velocity spraying, a layer of coolant can form on surface 2 such that boiling occurs within the layer. As boiling occurs, bubbles will tend to grow causing the portion of surface 2 under the bubble to not be wetted. However, the constant bombardment of liquid spray droplets onto surface 2 can help displace the bubbles and prevent the bubbles from growing larger. In this way, a larger portion of surface 2 can be kept wetted so as to increase heat transfer. Spray patterns from atomizing spray nozzles in accordance with the subject invention can be, for example, round, square, rectangular (which can be referred to as a fan spray pattern), or other shape appropriate to the shape of surface 2 and/or the partition walls 21. Preferably, for each shape spray pattern, an even spray pattern is achieved by the atomizing spray nozzle.

The subject method and apparatus can be utilized as an open system where the coolant which is converted to gas or vapor upon spraying onto surface 2 can escape, for example, into the environment. In such an open system, the coolant which remains in liquid form can be collected and reused. If desired, the collected liquid coolant can be cooled before reuse, or spraying back onto surface 2. The subject method and apparatus can also be utilized as a closed system where at least a portion, and preferably essentially all, of the coolant which is converted to gas or vapor upon spraying onto surface 2, as well as the coolant which remains in liquid form, can be collected and reused. In a specific embodiment, the subject method can utilize a sealed housing, which can maintain a pressure different from the environment, to contain the coolant and collect and process the coolant.

Figure 5:
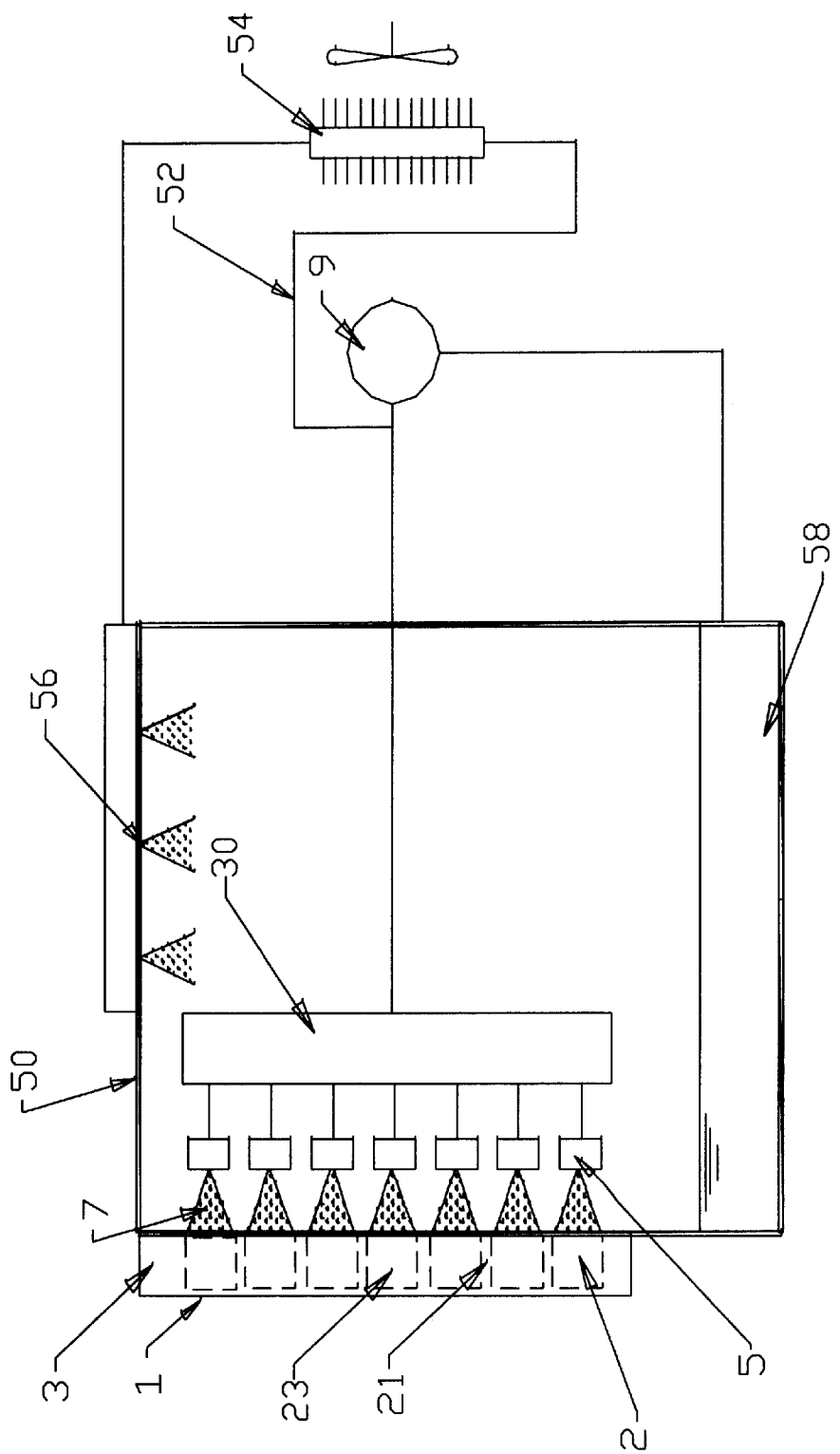
FIG. 5 shows an embodiment of the subject invention incorporating a closed loop structure.

Referring to FIG. 5, a specific embodiment with a closed loop cycle is shown. Spray manifold 30 can be placed within a sealed housing 50. Sealed housing 50 can be any of a variety of shapes and topologies and encapsulates a region where the pressure can be controlled. Interface plate 3 can function as one of the walls of housing 50. The cooling process can be substantially similar to the process described with respect to FIG. 1. The flow pattern can be varied and can vary with the type of nozzle used. In a specific embodiment, pressure atomizer nozzles can be used. Referring back to FIG. 5, liquid coolant can be drawn from reservoir 58 and pressurized via liquid coolant pump 9. Liquid coolant pump 9 can send pressurized liquid coolant into spray nozzle manifold 30. The liquid coolant can be distributed into the array of spray nozzles 5 and sprayed into compartments 23 of the interface plate 3. Interface plate 3, as in the other embodiments of the subject invention, can be a separate plate in thermal contact with a heat source, or can be integral with a heat source, for example, a wall of a device producing heat which needs to be removed. Due to heat supplied by a heat source to surface 1, at least a portion of the liquid coolant can vaporize as it contacts surface 2 of compartment 23. The vapor can then flow into the housing 50. The embodiment shown in FIG. 5 can also be implemented without spray manifold 30 and, instead, with other nozzle options, for example a single nozzle.

To condense the vapor and remove the heat acquired from the heat source, a condenser can be placed within the housing. The condenser can consist of a standard vapor to liquid heat exchanger with cold liquid supplied via a vapor compression cycle to the liquid ports of the heat exchanger. The warm vapor condenses on the heat exchanger, releasing its heat to the vapor compression cycle and flows into the reservoir.

A more efficient method of condensing the vapor and removing the heat involves adding another set of spray nozzles 56 to spray sub-cooled liquid coolant into the housing. A portion of the pressurized liquid from pump 9 can be sent to a heat exchanger 54 via tubing 52, rather than to manifold 30, to sub-cool a portion of the pressurized liquid coolant. Heat exchanger 54 can be, for example, a liquid-to-liquid heat exchanger cooled with liquid on one side of the exchanger. Liquid from a vapor compression cycle can be used for this purpose. If the saturation temperature of the housing 50 is above ambient, the heat exchanger 54 can be a vapor-to-liquid heat exchanger cooled by ambient air. The sub-cooled liquid coolant can then be directed to one or more pressure atomizer nozzles 56 and sprayed within the housing. The saturated vapor generated within the housing can contact the sub-cooled droplets. The saturated vapor can condense on the sub-cooled droplets to form larger droplets, which can flow into the reservoir to be reused in the process.

Figure 6:
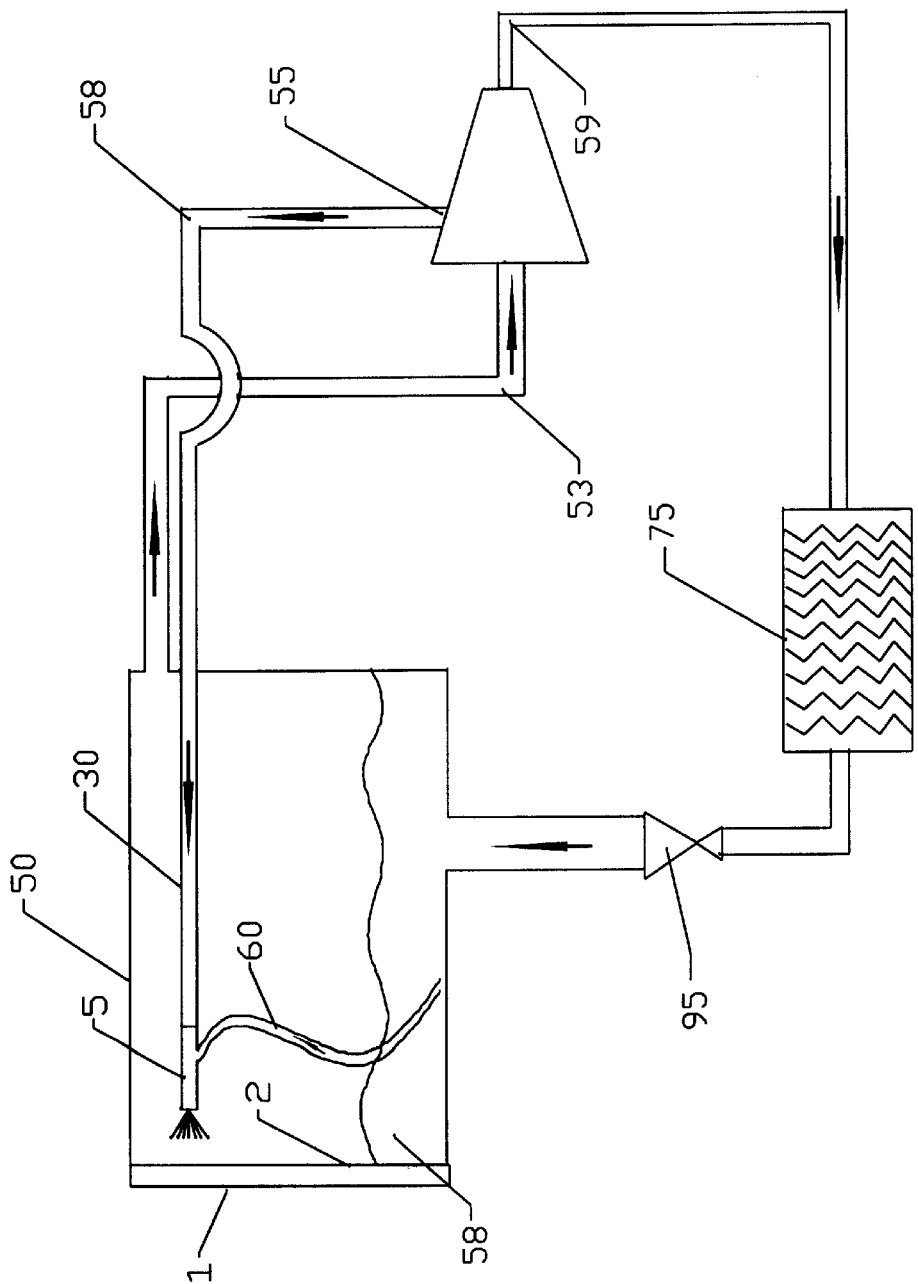
FIG. 6 shows an embodiment of the subject invention in which an evaporative spray cooling loop is combined with a vapor compression cycle.

Referring to FIG. 6, in another specific embodiment of the subject invention, the evaporative spray cooling loop can be combined with the vapor compression cycle. In contrast with the closed loop system previously described with reference to FIG. 5, which used a coolant in the evaporative spray cooling loop to transfer the heat from the heat source to a vapor compression cycle via heat exchanger 54, in the embodiment shown in FIG. 6, the heat exchanger can be removed and a single coolant used. The use of a single coolant in this embodiment can allow for a more efficient and compact system.

Again referring to FIG. 6, the system can utilize a sealed and pressurized evaporator housing 50. A heat source can be thermally coupled to surface 1. Heat coupled to surface 1 can be removed by the evaporation of the coolant sprayed onto surface 2 of the interface plate. Interface plate 3, as in the other embodiments of the subject invention, can be a separate plate in thermal contact with a heat source, or can be integral with a heat source, for example, a wall of a device producing heat which needs to be removed. The vapor generated by the cooling process can be pulled from housing 50 via vapor compressor 55. The vapor can enter vapor compressor 55 through tubing 53 and be pressurized. The vapor compression can have two stages: one for powering one or more spray nozzles 5 through tubing 57 and another to complete the vapor compression cooling cycle through tubing 59. In a specific embodiment, this two stage design can be accomplished with a two stage compressor 55 with outlet ports designed to discharge the compressed vapor at the desired compression ratios. In an alternative embodiment, two compressors can be utilized: the first one compressing to the pressure required to power the spray nozzle and the second for compressing the vapor to desired pressure to complete the vapor compression cycle. In another alternative embodiment, a single stage compressor can be used which compresses all the vapor to the desired pressure for the vapor compression cycle and which bleeds off the portion needed for the spray nozzle through an expansion valve, turbine, or nozzle.

Figure 10:
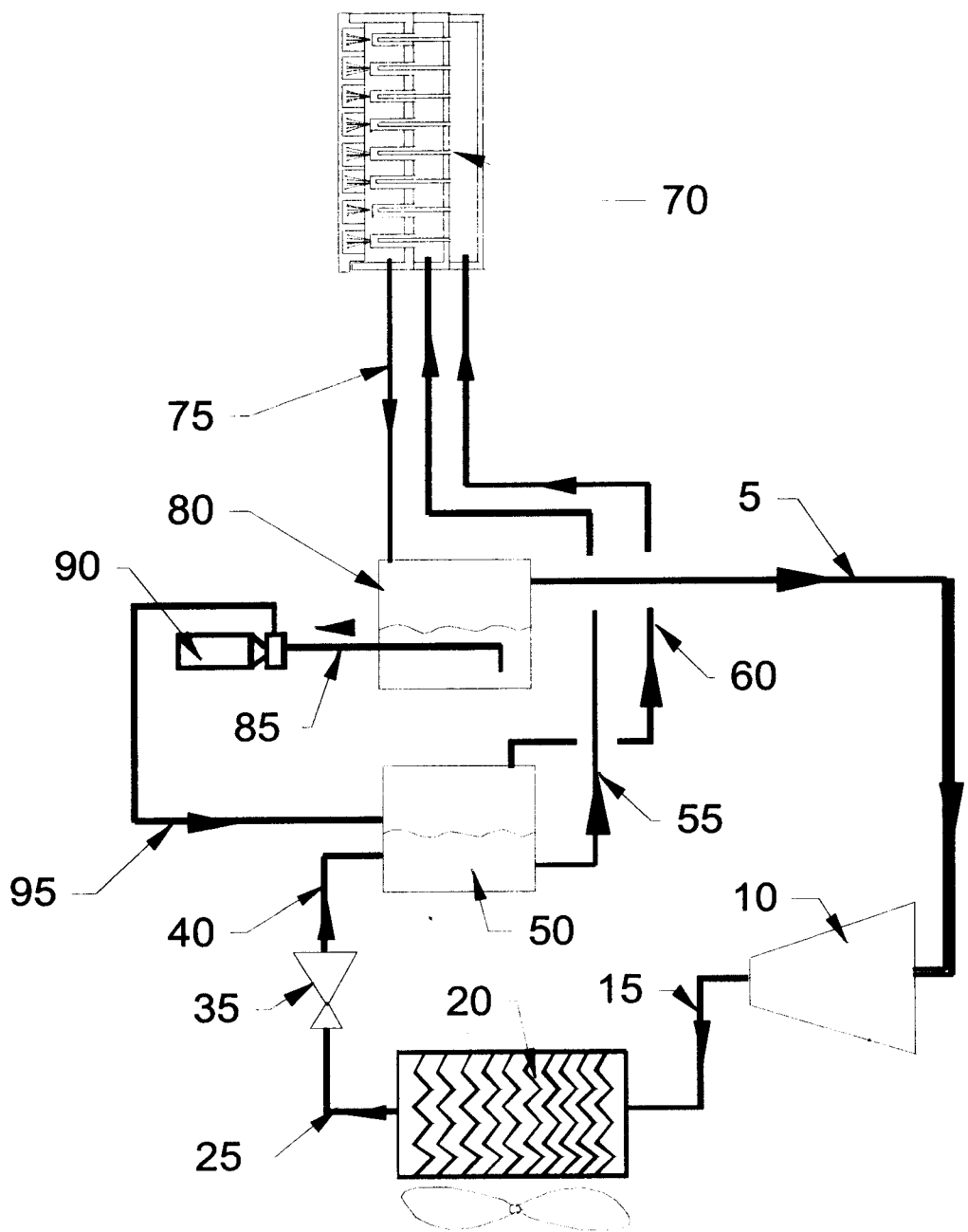
FIG. 10 shows an embodiment of the subject invention in which an evaporative spray cooling loop is combined with a vapor compression cycle, further incorporating an accumulator and a phase separator.

The pressurized vapor used to power the one or more spray nozzles 5 can port directly back into the spray nozzle manifold. Depending on the nozzle used, the liquid from the reservoir 58 can either be pumped to the liquid port of the spray nozzle manifold or sucked through it via venturi action, for example through tubing 60. The second port from compressor 55 can discharge vapor at the desired pressure to complete the vapor compression cooling cycle. The superheated compressed vapor can then be channeled to condenser 75. Within the condenser, which can utilize, for example, an air, gas, or liquid heat exchanger, the high temperature compressed vapor can be cooled and condensed to a saturated liquid. The cooled saturated liquid can exit the condenser and be channeled to an expansion valve, turbine, or nozzle 95. The expansion valve, turbine, or nozzle can cause the pressure of the saturated liquid coolant to drop to the pressure and corresponding saturation temperature of the evaporator housing 50. The mixed quality liquid can then exit the expansion valve, turbine, or nozzle 95 and be channeled to the liquid reservoir 58 waiting to be reused. Using a turbine rather than an expansion valves would allow the recapture of the energy normally lost through the expansion valves. Using a nozzle can allow for direct spraying of the liquid coolant onto heat transfer surface 2 if, for example, a pressure atomizer nozzle is used. Alternatively, with respect to the embodiment shown in FIG. 6, a phase separator as shown in FIG. 10 could be placed after expansion valve 95 and reservoir 58 such that tubing 57 could receive vapor coolant from the phase separator rather than compressor 55.

Example 1

Method for Spray Impingement Heat Exchanger

The system described in this example can utilize the technique of spraying coolant onto a surface in order to transfer heat from the surface to the coolant and can also utilize the spraying of coolant onto a surface to transfer heat from the coolant to the surface. By spraying a first, hot, coolant onto a first surface of a dividing wall and a second coolant onto an opposite surface of the dividing wall, heat can be transferred from the first coolant to the second coolant. In this example, a housing with a dividing wall, two fluid spray nozzle assemblies and two fluid outlets can be utilized. The dividing wall in the housing separates the two flows in the heat exchanger. One fluid is sprayed on one side of the wall and the other is sprayed on the other side of the wall. The intense convection that develops from either the direct impingement and/or the evaporation for a two-phase flow design allows for a very small heat exchanger to exchange a considerable amount of heat.

Figure 7:
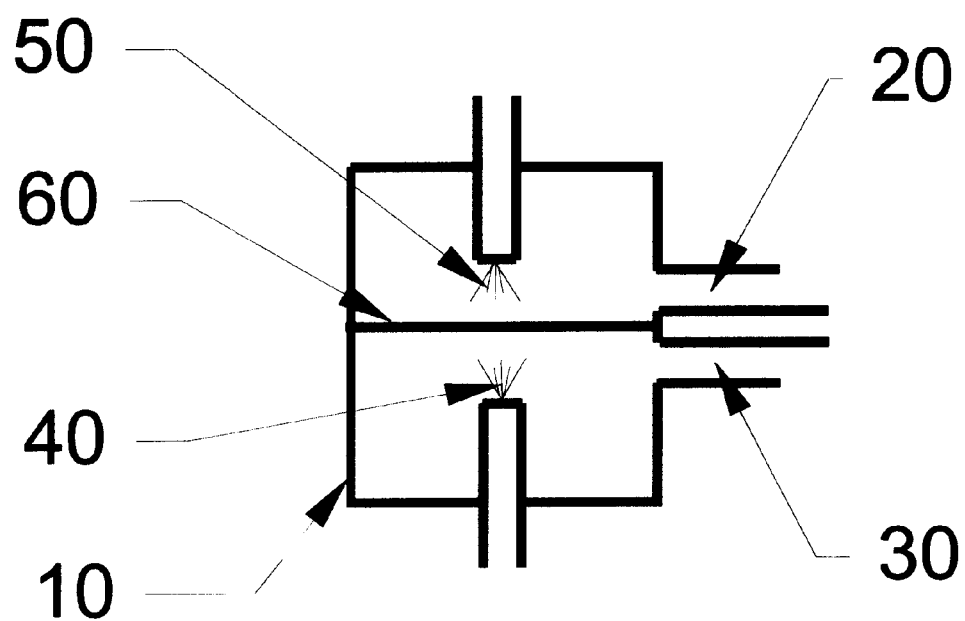
FIG. 7 shows a specific embodiment of a heat exchanger in accordance with the subject invention.

Referring to FIG. 7, a closed housing 10 can incorporate a dividing wall 60 within the housing which separates the housing into two housing compartments. In one of the housing compartments, a spray nozzle or series of spray nozzles 40 can spray a first fluid onto one side of wall 60. The first fluid can leave this housing compartment via outlet port 30. One the other side of the dividing wall 60, a spray nozzle or series of spray nozzles 50 can spray a second fluid onto the dividing wall. This second fluid can leave this compartment via outlet port 20. The first and second fluids can be chosen based on their properties, such as boiling point.

Heat can then be transferred between the fluids through wall 60. The convection heat transfer coefficient that is developed with both single phase and two-phase spray impingement is very high. This high coefficient allows the heat exchanger to be much more compact in size and efficient when compared to current heat exchanger technology. Wall 60 can be a flat surface or an engineered spray cooling surface such as a honeycomb or cubic chamber style surface, such as described in the subject application. Additionally, fins or other surface extension mechanism can be added to wall 60 to increase the effective surface area to increase the heat transfer through the wall 60.

Example 2

Spray Nozzle Expansion in Vapor Compression Cycle Spray Cooling

The system described in this example can be utilized with various embodiments of the subject invention. Specific embodiments in accordance with the subject invention can comprise three main components: a compressor, a condenser, and a spray cooling expansion valve interface assembly. The cycle can begin with the compressor pulling in coolant vapor from the spray cooling assembly, and the coolant vapor being compressed to a temperature above ambient. The hot vapor can then flow through a heat exchanger to condense the vapor to liquid. The compressed hot liquid can be expanded through a nozzle and sprayed onto the spray cooling interface, or heated surface 2. Interface plate 3, as in the other embodiments of the subject invention, can be a separate plate in thermal contact with a heat source, or can be integral with a heat source, for example, a wall of a device producing heat which needs to be removed. A heat source, such as a laser diode or other heat exchange medium, attached on the other side of the interface can be cooled by the expanding and evaporating liquid. The liquid coolant can be vaporized as it removes the heat from the heat source via the interface. In embodiments where some of the coolant is not vaporized as it departs from the interface, an accumulator can be inserted between the coolant departing the interface and the compressor in order to reduce the amount, or prevent, liquid coolant from entering the compressor. A transfer pump can be used to transfer excess liquid from the accumulator to the liquid supply line to the nozzle.

Figure 8:
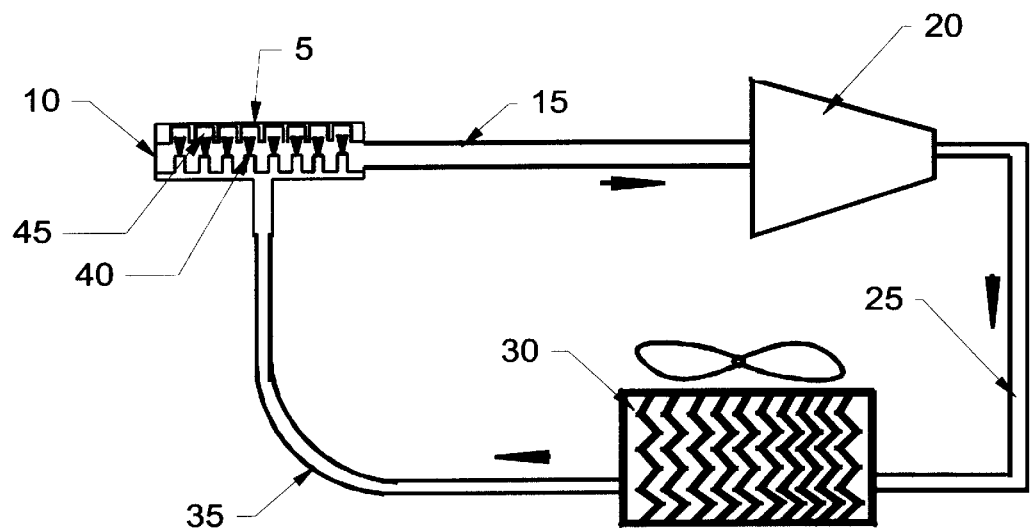
FIG. 8 shows an embodiment of the subject invention in which an evaporative spray cooling loop is combined with a vapor compression cycle.
Figure 9:
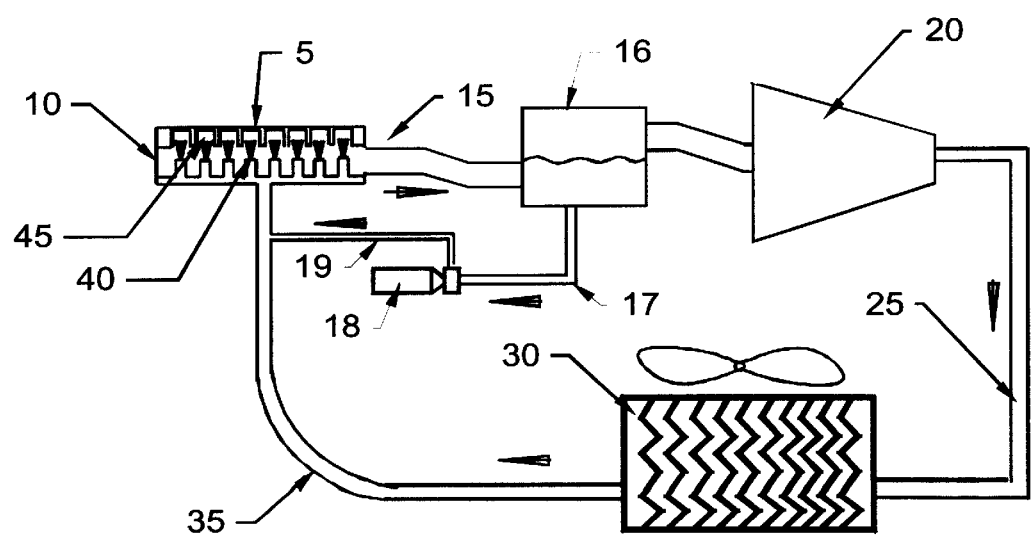
FIG. 9 shows an embodiment of the subject invention in accordance with the embodiment shown in FIG. 8, further incorporating an accumulator.

Referring to FIGS. 8 and 9, the cycle can begin with a spray cooling expansion evaporator 10, which removes heat from a heat source 5. The expansion evaporator 10 can receive pressurized liquid coolant and allow the coolant to expand between entering the nozzle and exiting the nozzle. The nozzle can also atomize the coolant as the coolant exits the nozzle and is sprayed onto the heated surface As the liquid coolant is sprayed onto the heated interface wall 45 the coolant can vaporize as it gains heat. Interface wall 45, as in the other embodiments of the subject invention, can be a separate plate in thermal contact with a heat source, or can be integral with a heat source, for example, a wall of a device producing heat which needs to be removed. The vaporized coolant can flow from the expansion evaporator via connection piping 15 to a compressor 20. The compressor compresses the vapor coolant to a temperature above the temperature of the condenser 30 coolant flow. The compressed hot vaporized coolant can flow from the compressor 10 to the condenser 30 via connecting pipe 25. The condenser 30 can be a heat exchanger of any type designed to remove heat from a vaporized coolant, such as an ambient air to liquid heat exchanger. The pressurized hot coolant vapor is cooled in the condenser 30 and condenses to liquid as its heat is removed. The pressurized liquid coolant can flow from the condenser 30 via connecting pipe 35 to the spray cooling expansion evaporator 10 inlet. The expansion evaporator can comprise a nozzle or a series of nozzles 40 which can spray the pressurized liquid coolant on to the heat interface wall 45. The cycle can then begin again and can run in a continuous loop while cooling is desired.

Under some operating conditions, excess liquid can be sprayed from the impingement nozzle 40 for enhanced heat transfer. In this case, accumulator 16, as shown in FIG. 9, may be added on line 15. The accumulator can retain excess liquid in line 15 from entering compressor 20. Liquid coolant can accumulate in accumulator 16. A liquid pump 18 can pump the excess liquid from accumulator 16 via connecting line 17 to the liquid supply line 35 via pump discharge connecting line 19.

Example 3

Phase Separator for Spray Impingement Evaporator for Vapor Compression Cycle

This example describes a phase separator which can be utilized with subject spray impingement evaporator for vapor compression cycles in accordance with the subject invention. A spray impingement evaporator can be added to a vapor compression cycle to improve the heat transfer capabilities of the evaporator. The process can begin with a compressor taking in vapor from an accumulator. The compressed hot vapor exiting the compressor goes to a condenser to change the phase of the vapor to liquid. The liquid can then be expanded through an expansion valve. As liquid coolant is pumped from the accumulator to the phase separator, the liquid in the phase separator can be at a higher pressure than in the accumulator which receives vapor and liquid coolant from the impingement evaporator through, for example, tubing 75. The cooled liquid can then be used in a spray impingement evaporator. The spray can be achieved, for example, either through the use of another compressor, enlarging the existing compressor, and/or a utilizing liquid coolant pump.

The addition of the phase separator in this cycle in accordance with this example can allow the process to use at least a portion of the energy normally wasted in the expansion device to power the spray nozzles. The process enhancement can add the phase separator after the expansion valve. However, in this case the pressure drop across the expansion valve can be small. This allows a liquid vapor mixture at high pressure to collect in the phase separator. The high pressure fluid can then be used directly to power the spray nozzle in the spray impingement evaporator. Since the fluid is in both liquid and vapor phase, either a pressure atomizer or vapor atomizing nozzle can be used in the evaporator. A transfer pump may be used to transfer excess liquid from the accumulator to the phase separator.

Referring to FIG. 10, the process can begin with a coolant vapor flowing from an accumulator 80 via compressor intake line 5 to the compressor 10. The vaporized coolant can be pressurized causing the temperature to rise. The hot coolant vapor can flow from the compressor 10 to the condenser 20 via connection line 15. The condenser 20 is a heat exchanger designed to remove heat from the hot vapor causing it to change phase to liquid. Condenser 20 can be any type of heat exchanging device, such as an air to liquid style allowing the heat to be pumped into ambient air. The compressed liquid coolant can flow from the condenser 20 to the expansion device 35 via connecting line 25. The expansion of the compressed liquid coolant can cause it to vaporize and cool. The mixed phase coolant can flow from the expansion device 35 via connecting line 40 to the phase separator 50. The expansion permitted in the expansion device 35 can be limited as compared to a conventional vapor compression cycle so that the pressure within the phase separator is higher that the pressure in the accumulator. As liquid coolant is pumped from the accumulator to the phase separator, the liquid in the phase separator can be at a higher pressure than in the accumulator which receives vapor and liquid coolant from the impingement evaporator through, for example, tubing 75. The phase separator can separate the phases to liquid and vapor. The liquid coolant can flow from the bottom of the phase separator via connecting line 55 to the spray nozzle liquid inlet port in the spray impingement evaporator 70. The spray impingement evaporator 70 can incorporate an interface plate 3 as discussed with respect to FIG. 1 and others. Interface plate 3, as in the other embodiments of the subject invention, can be a separate plate in thermal contact with a heat source, or can be integral with a heat source, for example, a wall of a device producing heat which needs to be removed. The vapor coolant from the phase separator can flow via vapor connecting line 60 to either the vapor inlet port of the spray nozzle or directly to the accumulator depending on the type of nozzle used in the spray impingement evaporator 70. The liquid coolant gains heat in the evaporator and vaporizes. The vaporized coolant and excess liquid can flow from the spray impingement evaporator 70, via connecting line 75, to the accumulator 80. A transfer pump 90 may be added to the cycle to transfer excess liquid from the accumulator 80 via connecting line 85 to the phase separator 50 via connecting pipe 95.

Referring to FIG. 10, but not limited to the embodiment shown in FIG. 10, spray impingement evaporator 70 is shown connected to the vapor compression cycle via lines 55, 60, and 75. In this way the spraying and vapor compression functions can be geographically separated. This can allow a smaller housing for spray impingement evaporator 70 which takes up less space and can be more conveniently brought into contact with heat sources where space can be a premium. In addition, a plurality of spray impingement evaporators 70 can be connected to a single vapor compression cycle system through a corresponding plurality of lines 55, 60, and 75. The physical separation of the spraying and vapor compression functions can be accomplished in the other embodiments described in the subject application. Again, spray impingement evaporator 70 can utilize one of a variety of nozzle types as described in the subject application. Also, as other embodiments described in the subject application utilized an essentially gravity-based phase separator, the phase separator shown in FIG. 10 could also be utilized with these embodiments.

All patents, patent applications, provisional applications, and publications referred to or cited herein are incorporated by reference in their entirety, including all figures and tables, to the extent they are not inconsistent with the explicit teachings of this specification.

Sample and embodiments described herein are for illustrative purposes only and that various modifications or changes in light thereof will be suggested to persons skilled in the art and are to be included within the spirit and purview of this application and the scope of the appended claims.

We claim:

1. A method of removing heat from a heat source, comprising:

locating a piece of material in thermal contact with a heat source, the piece of material comprising a first surface, wherein the first surface comprises a plurality of subsections wherein each subsection shares a partition wall with at least one adjacent subsection; and spraying a liquid coolant onto the first surface, wherein the liquid coolant sprayed onto the first surface absorbs heat from the first surface, and carries the absorbed heat away as the coolant leaves the first surface, wherein the partition wall shared by a subsection with an adjacent subsection reduces the flow of coolant from the subsection to the adjacent subsection and the flow of coolant from the adjacent subsection to the subsection.

2. The method according to claim 1, wherein spraying a liquid coolant onto the first surface comprises spraying an atomized liquid coolant onto the first surface.

3. The method according to claim 2, wherein spraying an atomized liquid coolant onto the first surface comprises spraying droplets having mean diameters in a range from about 10 microns to about 200 microns and velocities in a range from about 5 meters per second to about 50 meters per second.

4. The method according to claim 2, wherein spraying an atomized liquid coolant onto the first surface comprises spraying droplets having a size and velocity such that the effects of gravity are negligible.

5. The method according to claim 2, wherein spraying an atomized liquid coolant onto the first surface comprises spraying an atomized liquid spray onto the first surface with a pressure atomizer nozzle, wherein pressurized liquid is inputted to the pressure atomizer nozzle.

6. The method according to claim 2, wherein spraying an atomized liquid coolant onto the first surface comprises spraying an atomized liquid coolant onto the first surface with a vapor assist nozzle, wherein pressurized liquid coolant and pressurized vapor coolant is inputted to the vapor assist nozzle.

7. The method according to claim 2, wherein spraying an atomized liquid coolant onto the first surface comprises spraying an atomized liquid coolant onto the first surface with a pressurized vapor nozzle, wherein liquid coolant and vapor coolant is inputted to the pressurized vapor nozzle.

8. The method according to claim 2, wherein spraying an atomized liquid coolant onto the first surface comprises spraying an atomized liquid coolant onto the first surface with a vapor atomizing nozzle, wherein flow of vapor through the vapor atomizing nozzle creates a venturi draft on a liquid coolant source inputted to the vapor atomizing nozzle.

9. The method according to claim 2, wherein spraying an atomized liquid coolant onto the first surface forms a thin film of coolant on the first surface.

10. The method according to claim 2, wherein the coolant is sprayed such that when the atomized liquid coolant is sprayed onto the first surface the coolant can begin to boil.

11. The method according to claim 10, wherein a portion of the coolant which is sprayed onto the first surface evaporates and a remaining portion of the coolant which is sprayed onto the first surface exits the first surface out of the subsection due to the momentum of the coolant.

12. The method according to claim 2, wherein upon spraying an atomized liquid coolant onto the first surface, single phase convection, boiling, and/or free surface evaporation of the coolant occur.

13. The method according to claim 12, wherein coolant sprayed onto the first surface which boils and/or evaporates is released into the environment.

14. The method according to claim 2, wherein the first surface is located within a sealed housing and wherein spraying an atomized liquid coolant onto the first surface is within the sealed housing, wherein the method further comprises:

releasing the heat absorbed by the coolant from the first surface via a condenser.

15. The method according to claim 14, wherein the condenser comprises a heat exchanger.

16. The method according to claim 14, wherein the condenser operates via a subcooled mist of the coolant, wherein the sub-cooled mist of the coolant is sub-cooled below the saturation temperature of the coolant within the sealed housing via a heat exchanger, wherein the heat exchanger is outside the sealed housing, wherein the sub-cooled mist is sprayed within the sealed housing so as to contact saturated vapor of the coolant evaporating from the first surface, wherein heat is transferred from the saturated vapor to the sub-cooled mist such that the saturated vapor condenses on the sub-cooled mist and flows to a reservoir of the coolant.

17. The method according to claim 1, wherein the partition wall shared by a subsection with an adjacent subsection substantially eliminates the flow of coolant from the subsection to the adjacent subsection and the flow of coolant from the adjacent subsection to the subsection.

18. The method according to claim 1, wherein the piece of material is an interface plate comprising a second surface, wherein the second surface is in thermal contact with the heat source.

19. The method according to claim 1, wherein the piece of material is integral with the heat source.

20. The method according to claim 1, wherein the plurality of subsections each share a partition wall with each adjacent subsection.

21. The method according to claim 20, wherein the partition walls are interconnected so as to enclose a portion of the plurality of subsections with the interconnected partition walls.

22. The method according to claim 21, wherein the interconnected partition walls form a pattern such that the portion of the plurality of subsections are enclosed by polygonal shaped sections of the interconnected partition walls.

23. The method according to claim 22, wherein the portion of the plurality of subsections are enclosed by rectangular shaped sections of the interconnected partition walls.

24. The method according to claim 23, wherein the portion of the plurality of subsections are enclosed by square shaped sections of the interconnected partition walls.

25. The method according to claim 22, wherein the portion of the plurality of subsections are enclosed by hexagonal shaped sections of the interconnected partition walls.

26. The method according to claim 1, wherein spraying an atomized liquid coolant onto the first surface comprises spraying an atomized liquid coolant onto the first surface via a single spray nozzle such that the single spray nozzle sprays the atomized liquid coolant onto each subsection of the first surface.

27. The method according to claim 1, wherein spraying an atomized liquid coolant onto the first surface comprises spraying an atomized liquid coolant onto the first surface via a plurality of spray nozzles such that the plurality of spray nozzles sprays the atomized liquid coolant onto each subsection of the first surface.

28. The method according to claim 27, wherein each of the plurality of spray nozzles sprays the atomized liquid coolant onto a corresponding subsection of the first surface.

29. The method according to claim 1, wherein each subsection has a surface area of about 2 cm$^2$ or less.

30. The method according to claim 29, wherein each subsection has a surface area between about 0.5 cm$^2$ and about 2 cm$^2$.

31. The method according to claim 1, wherein the partition walls protrude at least about 0.2 cm from the first surface.

32. The method according to claim 31, wherein the partition walls protrude between about 0.2 cm and about 2 cm from the first surface.

33. An apparatus for removing heat from a heat source, comprising:
an interface plate, the interface plate comprising a first surface and a second surface, wherein the second surface is located in thermal contact with a heat source;
a spray nozzle which directs a spray pattern of the liquid coolant onto the first surface, wherein the liquid coolant sprayed onto the first surface absorbs heat from the first surface and carries the absorbed heat away as the coolant leaves the first surface,
wherein the first surface comprises a plurality of subsections wherein each subsection shares a partition wall with at least one adjacent subsection, wherein the partition wall shared by a subsection with an adjacent subsection reduces the flow of coolant from the subsection to the adjacent subsection and the flow of coolant from the adjacent subsection to the subsection.

34. The apparatus according to claim 33, wherein the spray nozzle atomizes the liquid coolant which is sprayed onto the first surface.

35. The apparatus according to claim 34 wherein the atomized liquid coolant sprayed onto the first surface comprises droplets having mean diameters in a range from about 10 microns to about 200 microns and velocities in a range from about 5 meters per second to about 50 meters per second.

36. The apparatus according to claim 34, wherein the atomized liquid coolant sprayed onto the first surface comprises spraying droplets having a size and velocity such that the effects of gravity are negligible.

37. The apparatus according to claim 34, wherein the spray nozzle comprises a pressure atomizer nozzle, wherein pressurized liquid is inputted to the pressure atomizer nozzle.

38. The apparatus according to claim 34, wherein the spray nozzle comprises a vapor assist nozzle, wherein pressurized liquid coolant and pressurized vapor coolant is inputted to the vapor assist nozzle.

39. The apparatus according to claim 34, wherein the spray nozzle comprises a pressurized vapor nozzle, wherein liquid coolant and vapor coolant is inputted to the pressurized vapor nozzle.

40. The apparatus according to claim 34, wherein the spray nozzle comprises a vapor atomizing nozzle, wherein flow of vapor through the vapor atomizing nozzle creates a venturi draft on a liquid coolant source inputted to the vapor atomizing nozzle.

41. The apparatus according to claim 34, wherein the atomized liquid coolant sprayed onto the first surface forms a thin film of coolant on the first surface.

42. The apparatus according to claim 34, wherein the coolant is sprayed such that when the atomized liquid coolant is sprayed onto the first surface the coolant can begin to boil.

43. The apparatus according to claim 42, wherein a portion of the coolant which is sprayed onto the first surface evaporates and a remaining portion of the coolant which is sprayed onto the first surface exits the first surface out of the subsection due to the momentum of the coolant.

44. The apparatus according to claim 34, wherein the atomized liquid coolant sprayed onto the first surface experiences single phase convection, boiling, and/or free surface evaporation of the coolant.

45. The apparatus according to claim 44, wherein coolant sprayed onto the first surface which boils and/or evaporates is released into the environment.

46. The apparatus according to claim 34, further comprising a sealed housing and a condenser, wherein the first surface is located within the sealed housing and wherein the atomized liquid coolant is sprayed onto the first surface within the sealed housing, wherein:
the heat absorbed by the coolant from the first surface is released via the condenser.

47. The apparatus according to claim 46, wherein the condenser comprises a heat exchanger.

48. The apparatus according to claim 46, further comprising a heat exchanger, and a reservoir of coolant wherein the condenser operates via a sub-cooled mist of the coolant, wherein the sub-cooled mist of the coolant is sub-cooled below the saturation temperature of the coolant within the sealed housing via the heat exchanger, wherein the heat exchanger is outside the sealed housing, wherein the sub-cooled mist is sprayed within the sealed housing so as to contact saturated vapor of the coolant evaporating from the first surface, wherein heat is transferred from the saturated vapor to the sub-cooled mist such that the saturated vapor condenses on the sub-cooled mist and flows to the reservoir of the coolant.

49. The apparatus according to claim 33, wherein the partition wall shared by a subsection with an adjacent subsection substantially eliminates the flow of coolant from the subsection to the adjacent subsection and the flow of coolant from the adjacent subsection to the subsection.

50. The apparatus according to claim 33, wherein the piece of material is an interface plate comprising a second surface, wherein the second surface is in thermal contact with the heat source.

51. The apparatus according to claim 33, wherein the piece of material is integral with the heat source.

52. The apparatus according to claim 33, wherein the plurality of subsections each share a partition wall with each adjacent subsection.

53. The apparatus according to claim 52, wherein the partition walls are interconnected so as to enclose a portion of the plurality of subsections with the interconnected partition walls.

54. The apparatus according to claim 53, wherein the interconnected partition walls form a pattern such that the portion of the plurality of subsections are enclosed by polygonal shaped sections of the interconnected partition walls.

55. The apparatus according to claim 54, wherein the portion of the plurality of subsections are enclosed by rectangular shaped sections of the interconnected partition walls.

56. The apparatus according to claim 55, wherein the portion of the plurality of subsections are enclosed by square shaped sections of the interconnected partition walls.

57. The apparatus according to claim 54, wherein the portion of the plurality of subsections are enclosed by hexagonal shaped sections of the interconnected partition walls.

58. The apparatus according to claim 33, wherein the spray nozzle comprises a single spray nozzle such that the single spray nozzle sprays the atomized liquid coolant onto each subsection of the first surface.

59. The apparatus according to claim 33, wherein the spray nozzle comprises a plurality of spray nozzles such that the plurality of spray nozzles sprays the atomized liquid coolant onto each subsection of the first surface.

60. The apparatus according to claim 59, wherein each of the plurality of spray nozzles sprays the atomized liquid coolant onto a corresponding subsection of the first surface.

61. The apparatus according to claim 33, wherein each subsection has a surface area of about 2 $cm^2$ or less.

62. The apparatus according to claim 61, wherein each subsection has a surface area between about 0.5 $cm^2$ and about 2 $cm^2$.

63. The apparatus according to claim 33, wherein the partition walls protrude at least about 0.2 cm from the first surface.

64. The apparatus according to claim 63, wherein the partition walls protrude between about 0.2 cm and about 2 cm from the first surface.

* * * * *

UNITED STATES PATENT AND TRADEMARK OFFICE
CERTIFICATE OF CORRECTION

PATENT NO.     : 6,571,569 B1
DATED          : June 3, 2003
INVENTOR(S)    : Daniel P. Rini et al.

It is certified that error appears in the above-identified patent and that said Letters Patent is hereby corrected as shown below:

Column 6,
Line 7, "FIGS. 2-2C" should read -- Figures 2A-2C --.

Signed and Sealed this

Thirtieth Day of December, 2003

JAMES E. ROGAN
*Director of the United States Patent and Trademark Office*